(12) United States Patent
Li et al.

(10) Patent No.: US 9,190,972 B2
(45) Date of Patent: Nov. 17, 2015

(54) AUTOMATIC GAIN CONTROL DEVICE AND METHOD, POWER ADJUSTING DEVICE AND RADIO TRANSMITTING SYSTEM

(71) Applicant: FUJITSU LIMITED, Kawasaki-shi, Kanagawa (JP)

(72) Inventors: Hui Li, Beijing (CN); Takanori Iwamatsu, Kawasaki (JP); Jianmin Zhou, Beijing (CN)

(73) Assignee: FUJITSU LIMITED, Kawasaki (JP)

( * ) Notice: Subject to any disclaimer, the term of this patent is extended or adjusted under 35 U.S.C. 154(b) by 91 days.

(21) Appl. No.: 13/755,925

(22) Filed: Jan. 31, 2013

(65) Prior Publication Data

US 2013/0194041 A1  Aug. 1, 2013

(30) Foreign Application Priority Data

Jan. 31, 2012  (CN) .......................... 2012 1 0022055

(51) Int. Cl.
*H03G 3/20* (2006.01)
*H03G 3/30* (2006.01)
*H03F 1/32* (2006.01)
*H03M 1/18* (2006.01)
*H04L 27/36* (2006.01)
*H04L 27/38* (2006.01)

(52) U.S. Cl.
CPC .............. *H03G 3/20* (2013.01); *H03F 1/3247* (2013.01); *H03G 3/3042* (2013.01); *H03M 1/185* (2013.01); *H04L 27/368* (2013.01); *H04L 27/3809* (2013.01)
USPC ........................................................ 330/129

(58) Field of Classification Search
CPC ....................................................... H03G 3/20
USPC ................................ 330/129, 279; 455/127.2
See application file for complete search history.

(56) References Cited

U.S. PATENT DOCUMENTS

| | | | |
|---|---|---|---|
| 6,151,400 A | 11/2000 | Seligman | |
| 7,675,360 B2 * | 3/2010 | Arai et al. | 330/129 |
| 2006/0068733 A1 | 3/2006 | Wang | |
| 2006/0261992 A1 | 11/2006 | Lusky et al. | |
| 2009/0258640 A1 | 10/2009 | Persson et al. | |
| 2011/0140778 A1 | 6/2011 | Cho et al. | |

FOREIGN PATENT DOCUMENTS

| | | |
|---|---|---|
| CN | 1819452 A | 8/2006 |
| CN | 102007689 A | 4/2011 |

OTHER PUBLICATIONS

Chinese Office Action dated Feb. 4, 2015, Appln. 201210022055.3.

* cited by examiner

*Primary Examiner* — Steven J Mottola
(74) *Attorney, Agent, or Firm* — Arent Fox LLP

(57) ABSTRACT

An automatic gain control device includes: a variable gain adjusting unit, for adjusting an input signal by a variable gain and outputting an adjustment result; an analog-digital converting unit, for performing analog-digital conversion on the adjustment result to obtain an analog-digital conversion result; and a gain determining unit, for determining a distribution status over a predetermined period of time of a maximum or a minimum of the analog-digital conversion result, comparing the distribution status with a first distribution condition, and if the distribution status meets the first distribution condition, then keeping the variable gain unchanged, otherwise changing the variable gain and determining newly a distribution status until the newly determined distribution status meets a second distribution condition which is at least as strict as the first distribution condition.

16 Claims, 8 Drawing Sheets

AUTOMATIC GAIN CONTROL DEVICE AND METHOD, POWER ADJUSTING DEVICE AND RADIO TRANSMITTING SYSTEM

FIELD OF THE INVENTION

The present invention relates to the field of signal processing and in particular to an automatic gain control device, an automatic gain control method, a power adjusting device and a radio transmitting system.

BACKGROUND OF THE INVENTION

Nonlinearity inherent to Power Amplifiers (PAs) used in radio communication systems may result in out-band spectrum spreading and in-band signal distortion of output signal power and further degrade the performance of the communication systems. At present, adaptive pre-distorters have been widely used in the wireless communication systems to compensate for the effects due to the nonlinearity of the power amplifiers.

An adaptive scalar pre-distorter samples out-band power of an output signal of a power amplifier and adjusts parameters of the pre-distorter adaptively to a change in power thereof to thereby achieve linearity of the power amplifier, as illustrated in FIG. 1. FIG. 1 illustrates a configuration of a power amplifying system 1 with an adaptive scalar pre-distorter. The power amplifying system 1 receives an input signal from a signal source 2 and provides the signal amplified in power to an antenna 3. The power amplifying system 1 includes a pre-distorting unit 14, a first Digital-Analog Converter (DAC) 15, an up-converter 16, a power amplifier 17, a feedback loop 18 and an algorithm updating module 19.

The pre-distorting unit 14 has nonlinearity corresponding to that of the power amplifier 17, and the signal pre-distorted by the pre-distorting unit 14 is processed by the first digital-analog converter 15 and the up-converter 16 and then amplified by the power amplifier 17 with nonlinear distortion into a resulting output signal in which nonlinear pre-distortion substantially cancels outs nonlinear distortion. Thus the signal output from the power amplifier 17 can be regarded as a result of linearly amplifying in power the input signal to the pre-distorting unit 14.

The feedback loop 18 obtains a power sample of the output signal of the power amplifier 17 and provides the algorithm updating module 19 with a cost function value for algorithm updating. The algorithm updating module 19 adjusts parameters of the pre-distorting unit 14 to the cost function value so that the nonlinearity of the pre-distorting unit 14 corresponds as closely as possible to that of the power amplifier 17. Upon convergence of the cost function value, it can be judged that the nonlinearity of the pre-distorting unit 14 has corresponded to that of the power amplifier 17.

As compared with an adaptive vector pre-distorter, this structure does not require synchronization for sampling points and thus lowers the complexity of implementing the feedback loop.

In the feedback loop 18 of FIG. 1, a dynamic range of an input signal to an Analog-Digital Converter (ADC) is typically adjusted through Automatic Gain Control (AGC) to lower the number of bit of the analog-digital converter. An automatic gain control algorithm module outputs a calculated gain value through the digital-analog converter to adjust a gain of a Variable Gain Amplifier (VGA). There is a requirement on the number of bits of the digital-analog converter in order for desired precision in adjusting the gain. As illustrated in FIG. 1, the feedback loop 18 includes a mixer 181, an Analog Band Pass Filter (ABPF) 182, a variable gain amplifier 183, an analog-digital converter 184, a cost function calculating module 185, an automatic gain control algorithm module 186 and a second digital-analog converter 187, where the automatic gain control algorithm module 186 provides the variable gain amplifier 183 with a variable gain g according to an analog-digital conversion result of the analog-digital converter 184.

A general idea of an existing automatic gain control algorithm is to ensure a specific statistical characteristic (e.g., average power, average amplitude, etc.) of an output signal of the analog-digital converter 184 to maintain a constant value all the time, as illustrated in FIG. 2. FIG. 2 illustrates a configuration of the feedback loop 18 in FIG. 1, where the automatic gain control algorithm module 186 includes a signal characteristic analyzing unit 186a and a gain generating unit 186b. Particularly for the automatic gain control algorithm to calculate in real time the statistical characteristic of the output signal of the analog-digital converter, the signal characteristic analyzing unit 186a needs to obtain an absolute value of the output signal of the analog-digital converter and compare the absolute value with a reference R, according to a result of which the gain generating unit 186b generates the variable gain g of the variable gain amplifier 183.

In this method, on one hand, the gain of the variable gain amplifier has to be adjusted in real time so as to ensure the statistical characteristic of the output signal of the analog-digital converter to be constant in real time, and on the other hand, the numbers of bits of the analog-digital converter and of the digital-analog converter in use may not be too low (for example, a 1-bit analog-digital converter may not be used).

SUMMARY OF THE INVENTION

The inventors have identified that only an amount of change in power of an out-band signal output from the power amplifier is required in the adaptive scalar pre-distorter without requiring any absolute power value of the out-band signal. In view of this feature, the present disclosure proposes an automatic gain control device and an automatic gain control method with improved performance and at a lowered cost as well as a power adjusting device and a radio transmitting system in which the automatic gain control device and the automatic gain control method are applied.

According to an embodiment of the present disclosure, there is provided an automatic gain control device including: a variable gain adjusting unit for adjusting an input signal by a variable gain and outputting an adjustment result; an analog-digital converting unit for performing analog-digital conversion on the adjustment result to obtain an analog-digital conversion result; and a gain determining unit for determining a distribution status over a predetermined period of time of a maximum or a minimum of the analog-digital conversion result, comparing the distribution status with a first distribution condition, and if the distribution status meets the first distribution condition, then keeping the variable gain corresponding to the distribution condition unchanged, or if the distribution status does not meet the first distribution condition, then changing the variable gain corresponding to the distribution condition and determining newly a distribution status until the newly determined distribution status meets a second distribution condition which is the same as or stricter than the first distribution condition.

According to an embodiment of the present disclosure, there is further provided a power adjusting device with an adaptive scalar pre-distorter, wherein the foregoing automatic gain control device is located on a feedback branch, for updating adaptively parameters of the adaptive scalar pre-distorter, of the power adjusting device, and the automatic gain control device takes a feedback signal as the input signal and outputs an cost function value, calculated from the analog-digital conversion result, for updating adaptively the parameters.

According to an embodiment of the present disclosure, there is further provided a radio transmitting system which uses the foregoing power adjusting device to adjust in power a signal from an input source and transmits the adjusted signal.

According to an embodiment of the present disclosure, there is also provided an automatic gain control method including: adjusting an input signal by a variable gain and outputting an adjustment result; performing analog-digital conversion on the adjustment result in order to obtain an analog-digital conversion result; and determining a distribution status over a predetermined period of time of a maximum or a minimum of the analog-digital conversion result, comparing the distribution status with a first distribution condition, and if such distribution status meets the first distribution condition, then keeping the variable gain corresponding to the distribution status unchanged, or if such distribution condition does not meet the first distribution condition, then changing the variable gain corresponding to the distribution status and determining newly a distribution status until the newly determined distribution status meets a second distribution condition which is the same as or stricter than the first distribution condition.

According to the embodiments of the present disclosure, the complexity in hardware can be lowered in automatic gain control, for example, the gain of the variable gain amplifier may not necessarily be adjusted in real time, or for example, an analog-digital converter or a digital-analog converter with a lower number of bits can be used. Furthermore the performance of automatic gain control can be improved as well in the embodiments of the present disclosure.

BRIEF DESCRIPTION OF THE DRAWINGS

The foregoing and other objects, features and advantages of the present disclosure will become apparent to those ordinarily skilled in the art with reference to the embodiments thereof and the drawings in which.

DETAILED DESCRIPTION OF THE INVENTION

Figure 1:
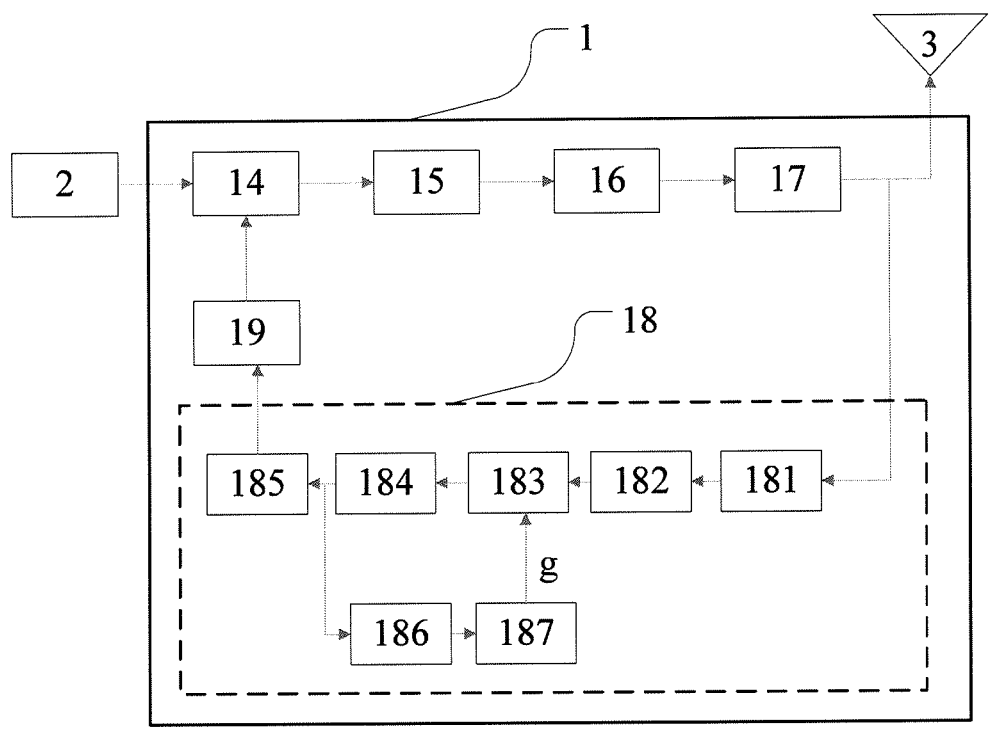
FIG. 1 illustrates a configuration of a traditional power amplifier system with an adaptive scalar pre-distorter.

According to an embodiment of the present disclosure, there is provided an automatic gain control device including: a variable gain adjusting unit for adjusting an input signal by a variable gain and outputting an adjustment result; an analog-digital converting unit for performing analog-digital conversion on the adjustment result to obtain an analog-digital conversion result; and a gain determining unit for determining a distribution status over a predetermined period of time of a maximum or a minimum of the analog-digital conversion result, comparing the distribution status with a first distribution condition, and if the distribution status meets the first distribution condition, then keeping the variable gain corresponding to the distribution status unchanged, or if the distribution status does not meet the first distribution condition, then changing the variable gain corresponding to the distribution status and determining newly a distribution status until the newly determined distribution status meets a second distribution condition which is the same as or stricter than the first distribution condition.

According to an embodiment of the present disclosure, there is further provided a power adjusting device with an adaptive scalar pre-distorter, wherein the foregoing automatic gain control device is located on a feedback branch, for updating adaptively parameters of the adaptive scalar pre-distorter, of the power adjusting device, and the automatic gain control device takes a feedback signal as the input signal and outputs an cost function value, calculated from the analog-digital conversion result, for updating adaptively the parameters.

According to an embodiment of the present disclosure, there is further provided a radio transmitting system which uses the foregoing power adjusting device to adjust in power an input signal and transmits the adjusted signal.

According to an embodiment of the present disclosure, there is also provided an automatic gain control method including: adjusting an input signal by a variable gain and outputting an adjustment result; performing analog-digital conversion on the adjustment result in order to obtain an analog-digital conversion result; and determining a distribution status over a predetermined period of time of a maximum or a minimum of the analog-digital conversion result, comparing the distribution status with a first distribution condition, and if such distribution status meets the first distribution condition, then keeping the variable gain corresponding to the distribution status unchanged, or if such distribution status does not meet the first distribution condition, then changing the variable gain corresponding to the distribution status and determining newly a distribution status until the newly determined distribution status meets a second distribution condition which is the same as or stricter than the first distribution condition.

In the following, an automatic gain control device, an automatic gain control method, a power adjusting device and a radio transmitting system according to the embodiments of the present disclosure will be described in connection with a first embodiment, a second embodiment and various variant examples thereof of the present disclosure.

[1. Configuration of First Embodiment]

A first embodiment of the present disclosure will be described below with reference to FIG. 3 and FIG. 4, and firstly a configuration of the first embodiment of the present disclosure will be described with reference to FIG. 3.

Figure 3:
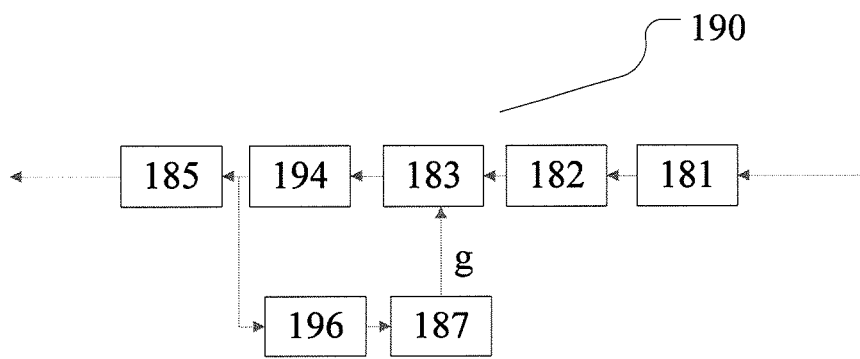
FIG. 3 illustrates a configuration example of an automatic gain control device according to a first embodiment of the present disclosure.

FIG. 3 illustrates a configuration example of an automatic gain control device according to a first embodiment of the present disclosure as an example of the automatic gain control device according to the embodiment of the present disclosure.

Figure 2:
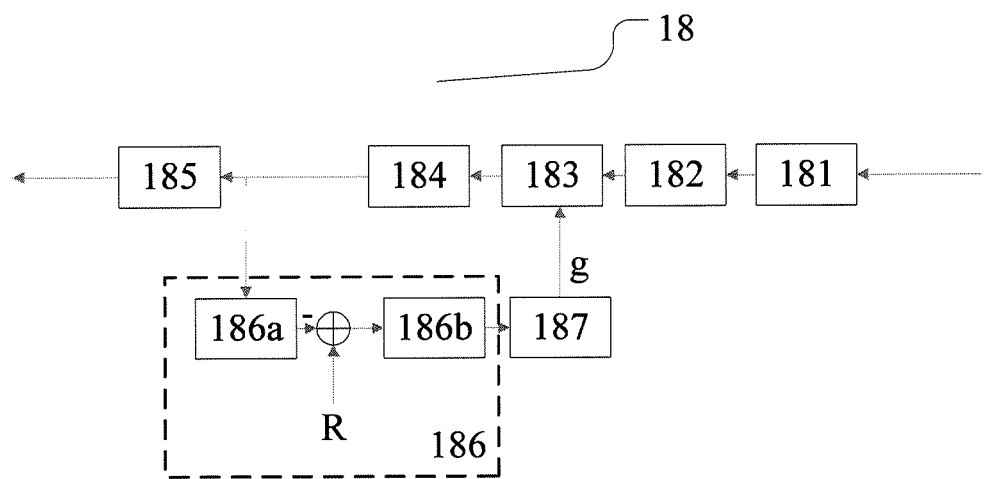
FIG. 2 illustrates a configuration of the feedback branch in FIG. 1.

The automatic gain control device 190 illustrated in FIG. 3 includes a mixer 181, an analog band pass filter 182, a variable gain amplifier 183, an analog-digital converter 194, a cost function calculating unit 185, an automatic gain control algorithm module 196 and a second digital-analog converter 187, where the mixer 181, the analog band pass filter 182, the variable gain amplifier 183 and the second digital-analog converter 187 are provided with substantially the same functions and configurations as the corresponding components described previously in FIG. 1 and FIG. 2 and thus with the same reference numerals.

It shall be noted that although the second digital-analog converter 187 is illustrated in FIG. 3, its function can be performed by the variable gain amplifier 183 or the automatic gain control algorithm module 196. In other words, the variable gain amplifier 183 can receive a variable gain g as a digital quantity, or the automatic gain control algorithm module 196 can output a variable gain g as an analog quantity. Thus the automatic gain control device 190 may not include the second digital-analog converter 187 in a variant example of the automatic gain control device according to the first embodiment of the present disclosure.

Furthermore the mixer 181 and the analog band pass filter 182 convert an obtained sample of a power signal or the like into an input signal suitable to variable gain amplifier 183 and can be replaced by another type of appropriate unit, or in some cases, the sample of a power signal or the like can be provided directly to the variable gain amplifier 183 without using the mixer 181 and the analog band pass filter 182. Thus the automatic gain control device 190 may not include the mixer 181 and the analog band pass filter 182 in a variant example of the automatic gain control device according to the first embodiment of the present disclosure.

Furthermore the cost function calculating unit 185 calculates a cost function value from an analog-digital conversion result, and for example, the calculated cost function value can be used to perform a process of updating adaptively parameters. An illustrative method of calculating the cost function value is to set the cost function value in direct proportion to the square of the analog-digital conversion result, that is, the cost function value is in direct proportion to the power of the analog-digital conversion result. Specifically, since the analog-digital conversion result is discrete in the time domain, the cost function value can be calculated by calculating the sum of squares of the analog-digital conversion result over the predetermined period of time (i.e., the power). However those ordinarily skilled in the art can calculate the cost function value from the analog-digital conversion result in other forms.

Furthermore the analog-digital conversion result can alternatively be output directly instead of the cost function value when the automatic gain control device is used for other purposes. Thus the automatic gain control device 190 may not include the cost function calculating unit 185 in a variant example of the automatic gain control device according to the first embodiment of the present disclosure.

Furthermore it shall be noted that the variable gain g of the variable gain amplifier 183 illustrated in FIG. 3 can be below 1 as required by design, that is, the variable gain amplifier 183 may not necessarily amplify but may attenuate the input signal.

The automatic gain control device 190 performs automatic gain control for the purpose of adjusting the variable gain g of the variable gain amplifier 183 to ensure an input signal to the analog-digital converter 194 to stay in an appropriate dynamic range. In a feedback branch of a power amplifying system with an adaptive scalar pre-distorter, the input signal to the variable gain amplifier 183 is out-band power of an output signal of the power amplifying system (e.g., a sample for the power of an output signal of the power amplifier processed by the mixer 181 and the analog band pass filter 182). However those ordinarily skilled in the art can appreciate that the input signal to the variable gain amplifier 183 can alternatively be a signal in other forms.

In a process of updating parameters by the adaptive scalar pre-distorter, the out-band power of the output signal of the power amplifying system is constantly changing, so it is necessary to adjust in real time the variable gain g of the variable gain amplifier 183 according to the change in out-band power so as to keep the signal input to the analog-digital converter 194 in an appropriate dynamic range.

The change in out-band power can be represented approximately by a distribution status of an output signal of the analog-digital converter 194. Thus according to an embodiment of the present disclosure, the distribution status of the output signal of the analog-digital converter 194 can be taken as an optimization target, the variable gain g of the variable gain amplifier 183 is adjusted, so that the signal input to the analog-digital converter 194 stays in an appropriate dynamic range.

Specifically a distribution status over a predetermined period of time of a maximum or a minimum of the output signal of the analog-digital converter 194 can characterize a change in out-band power of an input signal to the automatic gain control device, for example. An example of the distribution status is an occurrence probability over the predetermined period of time of the maximum or the minimum of the output signal of the analog-digital converter 194, where the maximum or the minimum of the output signal of the analog-digital converter is related to the variable gain g and to the number of bits of the analog-digital converter 194.

Furthermore the predetermined period of time can be a period required for the cost function calculating unit 185 to calculate a cost function once, for example, or can be set to another period of time.

It shall be noted that those ordinarily skilled in the art can appreciate that the foregoing distribution status can alternatively be embodied in other forms, for example, the distribution status can be embodied as the ratio of occurrence probabilities of the maximum and non-maximum, or the ratio of occurrence probabilities of the minimum and non-minimum, in the output signal of the analog-digital converter 194 counted over the predetermined period of time. Moreover the statistical period can also be selected appropriately as needed.

The inventors have identified that only a change in out-band power is required in the process of updating parameters by the adaptive scalar pre-distorter without requiring a precise value of the out-band power at each moment of time, so it is not necessary for the automatic gain control algorithm here to ensure all the time that the output signal of the analog-digital converter 194 stays in exactly the same dynamic range, and the variable gain g of the variable gain amplifier 183 is not necessarily adjusted as long as the output signal of the analog-digital converter 194 can reflect accurately the change in out-band power. Thus in an embodiment of the present disclosure, a first distribution condition is defined, and the variable gain g of the variable gain amplifier 183 will be adjusted only if the current distribution status of the output signal of the analog-digital converter 194 does not meet the first distribution condition. When the variable gain g is adjusted, a second distribution condition can be targeted so that the distribution status corresponding to the adjusted variable gain g meets the second distribution condition. Evidently, as an adjustment target, the second distribution condition can be the same as or stricter than the first distribution condition which is a condition to trigger adjustment.

"The second distribution condition can be the same as or stricter than the first distribution condition" as mentioned here means that a distribution status will certainly meet the first distribution condition if it meets the second distribution condition, but a distribution status will not certainly meet the second distribution condition even if it meets the first distribution condition.

It shall be noted that the first distribution condition and the second distribution condition can be predetermined in this embodiment. Specifically, with the occurrence probability of the minimum of the output signal of the analog-digital converter 194 being taken as the distribution status, the first distribution condition can correspond to a threshold extremum probalbity Pth, and the second distribution condition can correspond to a target extremum probalbity Ptg.

With the foregoing configuration, the analog-digital converter 194 can be an analog-digital converter with a lower number of bits than the analog-digital converter 184 used in the prior art and can even be a 1-bit analog-digital converter, thus lowering the complexity in hardware of automatic gain control.

[2. Process of First Embodiment]

An illustrative process of the first embodiment of the present disclosure will be described below with reference to FIG. 4.

Figure 4:
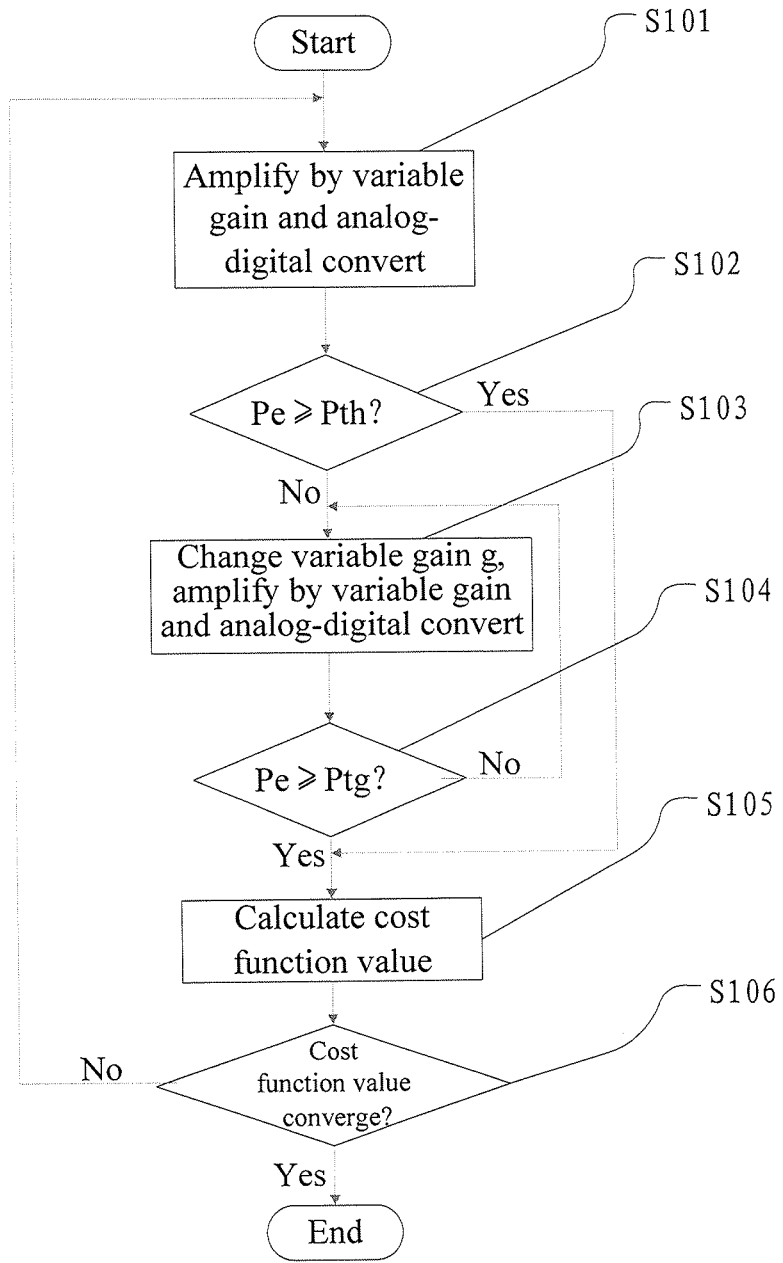
FIG. 4 illustrates a flow chart of an automatic gain control method according to the first embodiment of the present disclosure.

FIG. 4 illustrates a flow chart of an automatic gain control method according to the first embodiment of the present disclosure as an example of the automatic gain control method according to the embodiment of the present disclosure. The flow chart illustrated in FIG. 4 will be detailed below with reference to the automatic gain control device illustrated in FIG. 3.

In step S101, the variable gain amplifier 183 amplifies the input signal and outputs an amplification result, and the analog-digital converter 194 performs analog-digital conversion on the amplification result and obtains an analog-digital conversion result, and the process proceeds to step S102.

In step S102, the automatic gain control algorithm module 196 determines an extremum probability Pe over the statistic period of the minimum of the analog-digital conversion result and compares the extremum probability Pe with the threshold extremum probability Pth, and if Pe≥Pth, then the variable gain g is kept unchanged, and the process proceeds to the step S105; or if Pe<Pth, the process proceeds to step S103.

In step S103, the automatic gain control algorithm module 196 changes the variable gain g, the variable gain amplifier 183 amplifies the input signal and outputs an amplification result, and the analog-digital converter 194 performs analog-digital conversion on the amplification result and obtains an analog-digital conversion result, and the process proceeds to the step S104.

In step S104, the automatic gain control algorithm module 196 determines an extremum probability Pe over the statistic period of the minimum of the analog-digital conversion result and compares the extremum probability Pe with the target extremum probability Ptg, and if Pe≥Ptg, then the process proceeds to step S105; or if Pe<Ptg, the process returns to step S103.

It shall be noted that the automatic gain control algorithm module 196 can obtain the variable gain g, which causes the extremum probability Pe to reach the target extremum probability Ptg, by a one-dimension searching algorithm, particularly the Golden Section method or the Advance-Retreat method, in the process of steps S103 to S104. Those ordinarily skilled in the art can alternatively obtain the variable gain g, which causes the extremum probability Pe to reach the target extremum probability Ptg, in other known algorithms.

In step S105, the cost function calculating unit 185 calculates a cost function value from the analog-digital conversion result and proceeds to step S106. Specifically, since the analog-digital conversion result is discrete in the time domain, the cost function value can be calculated by calculating the sum of squares of the analog-digital conversion result over the predetermined period of time (i.e., the power)

In step S106, the cost function calculating unit 185 determines whether the obtained cost function value converges. The process ends if the cost function value converges or returns to step S101 when the cost function value does not converge. In the process of updating parameters by the adaptive scalar pre-distorter, convergence of the cost function value means that non-linearity of the pre-distorting unit substantially corresponds to that in the power amplifier, so adaptive updating of the parameters and thus the automatic gain control process can be terminated.

However, the automatic gain control process can alternatively continue subsequent to convergence of the cost function value as required by a specific scenario and design. Thus, in a modified example of the automatic gain control method according to the first embodiment of the present disclosurem the process of determining whether the cost function value converges in step S106 may not be performed but the process returns directly to step S101.

Furthermore the analog-digital conversion result can be output directly instead of the cost function value when the automatic gain control method is used for other purpose. Thus, in a modified example of the automatic gain control method according to the first embodiment of the present disclosure, the process of calculating the cost function value in step S105, and the process of determining whether the cost function value converges in step S106 may not be performed but the process will return directly to step S101. It shall be noted that the process here will be performed repeatedly as the feedback branch where the automatic gain control device 190 is located operates.

The automatic gain control device and the automatic gain control method according to the first embodiment of the present disclosure have been described above with reference to FIG. 3 and FIG. 4.

In a power adjusting device, e.g., a power amplifying system, with an adaptive scalar pre-distorter, the automatic gain control device according to the first embodiment of the present disclosure can be on a feedback branch, for updating adaptively parameters for the adaptive scalar pre-distorter, of the power adjusting device, and the automatic gain control device takes a feedback signal as the input signal and outputs the cost function value, calculated from the analog-digital conversion result, for updating adaptively the parameters. Such power adjusting device is an example of the power adjusting device according to the embodiment of the present disclosure.

In a radio transmitting system, the foregoing power adjusting device can be used to adjust in power a signal from an input source, and the adjusted signal can be transmitted. The radio transmitting system is an example of the radio transmitting system according to the embodiment of the present disclosure.

The automatic gain control device and the automatic gain control method according to the first embodiment of the present disclosure can be not only applicable to a feedback branch, of a power amplifier with an adaptive scalar pre-distorter, for updating adaptively parameters for the adaptive scalar pre-distorter, but also applicable to other system for which a similar feature is required, i.e., systems for which only a change in input signal is required without requiring a precision value of the input signal at each moment of time.

According to the first embodiment of the present disclosure, an analog-digital converter with a smaller dynamic range can be used to perform analog-digital conversion on the amplification result of the variable gain amplifier, that is, an analog-digital converter with a lower number of bits and even a 1-bit analog-digital can be used. Correspondingly an analog-digital converter with a smaller range can also be used. Thus the complexity in hardware and thus the cost of the device can be lowered. Moreover the performance of the device can also be improved.

Furthermore, according to the first embodiment of the present disclosure, the variable gain of the variable gain amplifier may not necessarily be changed in real time any longer, thus improving the performance of the device. Moreover a cost of the device in operation can also be lowered.

[3. Configuration of Second Embodiment]

A second embodiment of the present disclosure will be described below with reference to FIG. 5 to FIG. 8, and firstly a configuration of the second embodiment of the present disclosure will be described with reference to FIG. 5.

Figure 5:
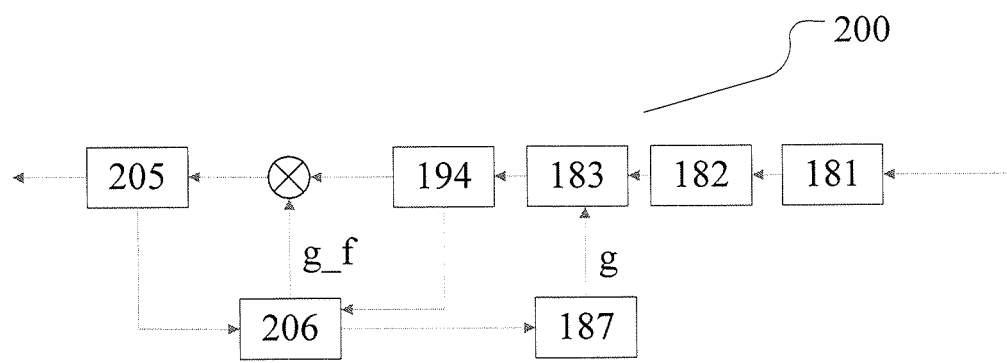
FIG. 5 illustrates a configuration example of an automatic gain control device according to a second embodiment of the present disclosure.

FIG. 5 illustrates a configuration example of an automatic gain control device according to a second embodiment of the present disclosure as an example of the automatic gain control device according to the embodiment of the present disclosure.

The automatic gain control device 200 illustrated in FIG. 5 includes a mixer 181, an analog band pass filter 182, a variable gain amplifier 183, an analog-digital converter 194, a cost function calculating unit 205, an automatic gain control algorithm module 206 and a second digital-analog converter 187, where the mixer 181, the analog band pass filter 182, the variable gain amplifier 183 and the second digital-analog converter 187 are provided with substantially the same functions and configurations as the corresponding components described previously in FIG. 1 and FIG. 2 and thus with the same reference numerals, and the analog-digital converter 194 are provided with substantially the same function and configuration as the corresponding components described previously in FIG. 3 and FIG. 4 and thus with the same reference numeral.

It shall be noted that like the description made with reference to FIG. 3, in a modified example of the automatic gain control device according to the second embodiment of the present disclosure, the automatic gain control device 200 may not include the second digital-analog converter 187.

Furthermore, like the description made with reference to FIG. 3, in a modified example of the automatic gain control device according to the second embodiment of the present disclosure, the automatic gain control device 200 may not include the mixer 181 and the analog band pass filter 182.

It shall be noted that like the description made with reference to FIG. 3, the variable gain amplifier 183 illustrated in FIG. 5 may not necessarily amplify but may attenuate the input signal.

The cost function calculating unit 205 receives the analog-digital conversion result from the analog-digital converter 194 and a revised gain g_f from the automatic gain control algorithm module 206, calculates a cost function value according to the product of the analog-digital conversion result and the revised gain g_f, and provides the automatic gain control algorithm module 206 with the calculated cost function value. An illustrative method of calculating the cost function value is to set the cost function value in direct proportion to the square of the product of the analog-digital conversion result and the revised gain g_f. Specifically, since the analog-digital conversion result is discrete in the time domain, the cost function value can be calculated by calculating the sum of squares of the product of the analog-digital conversion result and the revised gain g_f over the predetermined period of time. However those ordinarily skilled in the art can calculate the cost function value from the analog-digital conversion result in other forms.

Furthermore, in addition to the function of the automatic gain control algorithm module 196 in FIG. 3, the automatic gain control algorithm module 206 can further receive and store the cost function value from the cost function calculating unit 205 and the current analog-digital conversion result from the analog-digital converter 194, and determine a new revised gain g_f using the stored previously-calculated cost function value, a new variable gain g which causes the extremum probability Pe to reach the target extremum probability Ptg, and an analog-digital conversion result obtained with the new variable gain g each time the new variable gain g is determined, so that the cost function value is kept unchanged. In other words, the new revised gain g_f is determined so that the product of the analog-digital result obtained with the new variable gain g and the new revised gain g_f still corresponds to the previously-calculated cost function value. Thus the cost function value calculated each time a new variable gain g is determined will not be subjected to a sudden change, which facilitates rapid convergence of the cost function value. Here an initial value of the revised gain g_f can be set as needed, e.g., to 1, and subsequently revised each time a new variable gain g is determined.

It shall be noted that although it is shown in FIG. 5 that the automatic gain control algorithm module 206 receives and stores the cost function value from the cost function calculating unit 205 and the current analog-digital conversion result from the analog-digital converter 194, and determines the new revised gain g_f using the stored previously-calculated cost function value and the new variable gain g so that the cost function value is kept unchanged, however, in a modified example of the automatic gain control device according to the second embodiment of the present disclosure, the automatic gain control algorithm module 206 can determine otherwise the new revised gain g_f each time the new variable gain g which causes the extremum probability Pe to reach the target extremum probability Ptg is determined, so that the cost function value is kept unchanged. For example, the automatic gain control algorithm module 206 can store an analog-digital conversion result in a previous predetermined period and a previous revised gain g_f and calculate a previous cost function value from the analog-digital conversion result in the previous predetermined period and the previous revised gain g_f to thereby determine a new revised gain g_f, so that the cost function value is kept unchanged.

It shall be noted that although it is shown in FIG. 5 that the cost function value is calculated according to the product of the analog-digital conversion result and the revised gain g_f, however, in a modified example of the automatic gain control device according to the second embodiment of the present disclosure, the cost function value can be calculated according to another form of combination of the analog-digital conversion result and the revised gain g_f.

Furthermore, the cost function calculating unit 205 can operate only during the time when the automatic gain control algorithm module 206 keeps the variable gain unchanged. That is, in the course of the automatic gain control algorithm module 206 determining the variable gain g which causes the extremum probability Pe to reach the target extremum probability Ptg, the cost function calculating unit 205 temporarily performs no process and will not operate until the new variable gain g which causes the extremum probability Pe to reach the target extremum probability Ptg is determined. With this configuration, the performance of the automatic gain control device can be further improved.

[4. Process of Second Embodiment]

Figure 6:
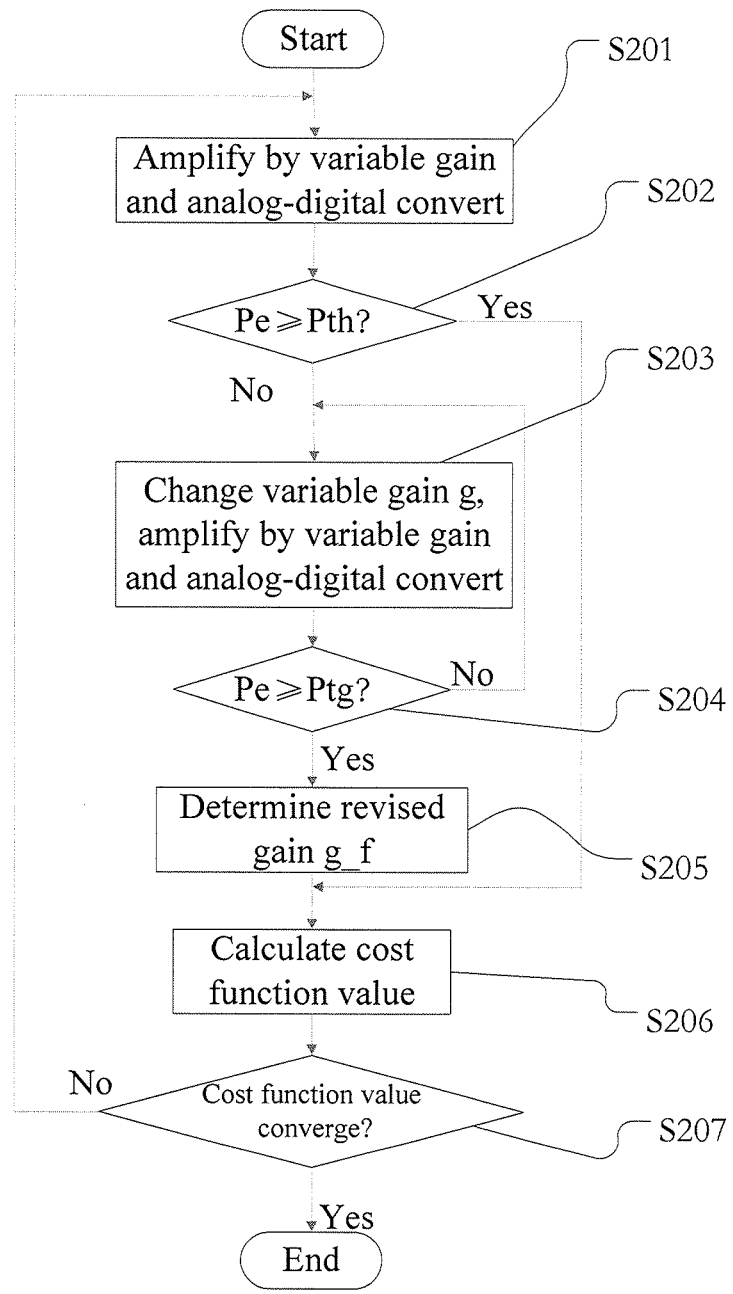
FIG. 6 illustrates a flow chart of an automatic gain control method according to the second embodiment of the present disclosure.

FIG. 6 illustrates a flow chart of an automatic gain control method according to the second embodiment of the present disclosure as an example of the automatic gain control method according to the embodiment of the present disclosure.

The flow chart illustrated in FIG. 6 will be detailed below with reference to the automatic gain control device illustrated in FIG. 5.

In step S201, the variable gain amplifier 183 amplifies the input signal and outputs an amplification result, and the analog-digital converter 194 performs analog-digital conversion on the amplification result and obtains an analog-digital conversion result, and the process proceeds to step S202.

In step S202, the automatic gain control algorithm module 206 determines an extremum probability Pe over the statistic period of the minimum of the analog-digital conversion result and compares the extremum probability Pe with the threshold extremum probability Pth, and if Pe≥Pth, then the variable gain g is kept unchanged, and the process proceeds to step S206; or if Pe<Pth, the process proceeds to step S203.

In step S203, the automatic gain control algorithm module 206 changes the variable gain g, the variable gain amplifier 183 amplifies the input signal and outputs an amplification result, and the analog-digital converter 194 performs analog-digital conversion on the amplification result and obtains an analog-digital conversion result, and the process proceeds to step S204.

In step S204, the automatic gain control algorithm module 206 determines an extremum probability Pe over the statistic period of the minimum of the analog-digital conversion result and compares the extremum probability Pe with the target extremum probability Ptg, and if Pe≥Ptg, then the process proceeds to step S205; or if Pe<Ptg, the process returns to step S203.

It shall be noted that in the processes of steps S203 to S204, similarly to the processes of steps S101 to S104, the variable gain g, which causes the extremum probability Pe to reach the target extremum probability Ptg, can be obtained by a one-dimension searching algorithm, particularly the Golden Section method or the Advance-Retreat method. Those ordinarily skilled in the art can alternatively obtain the variable gain g, which causes the extremum probability Pe to reach the target extremum probability Ptg with other known algorithms.

In step 205, the automatic gain control algorithm module 206 determines the new revised gain g_f, and the process proceeds to step S206. Specifically the automatic gain control algorithm module 206 determines the new revised gain using the cost function value previously received from the cost function calculating unit 205 and stored and the new variable gain g which causes the extremum probability Pe to reach the target extremum probability Ptg, in such a way that the cost function value is kept unchanged. That is, the value of the new revised gain g_f is determined so that the product of the analog-digital conversion result obtained with the new variable gain g and the new revised gain value g_f still corresponds to the previously-calculated cost function value.

As described with reference to FIG. 5, in a modified example of the automatic gain control method according to the second embodiment of the present disclosure, step S206 can be performed otherwise, that is, the automatic gain control algorithm module 206 determines the new revised gain g_f each time the new variable gain g which causes the extremum probability Pe to reach the target extremum probability Ptg is determined, so that the cost function value is kept unchanged.

In step S206, the cost function calculating unit 205 calculates a cost function value from the revised gain g_f and the analog-digital conversion result and proceeds to step S207. Specifically, the cost function value is set in direct proportion to the square of the product of the analog-digital conversion result and the revised gain g_f. Specifically, since the analog-digital conversion result is discrete in the time domain, the cost function value can be calculated by calculating the sum of squares of the product of the analog-digital conversion result and the revised gain g_f over the predetermined period of time.

In step S207, the cost function calculating unit 205 determines whether the obtained cost function value converges. The process ends if the cost function value converges, or returns to the step S201 when the cost function value does not converge. In the process of updating parameters by the adaptive scalar pre-distorter, convergence of the cost function value means that non-linearity of the pre-distorting unit substantially corresponds to that in the power amplifier, so adaptive updating of the parameters and thus the automatic gain control process can be terminated.

Alternatively the automatic gain control process can continue subsequent to convergence of the cost function value as required by a specific scenario and design. Thus, in a modified example of the automatic gain control method according to the second embodiment of the present disclosure, the process of determining whether the cost function value converges in step S207 may not be performed but the process returns directly to step S101.

[5. Simulation of Second Embodiment]

Figure 7:
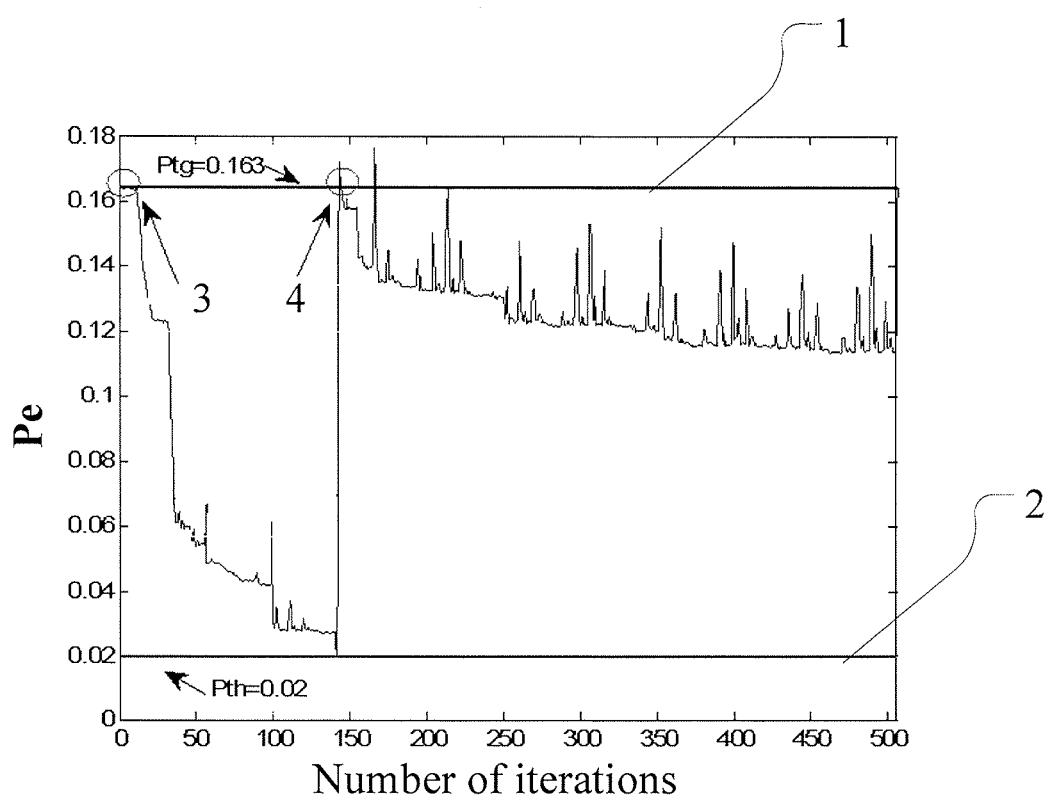
FIG. 7 illustrates a change in extremum probability in a simulation according to the second embodiment of the present disclosure.
Figure 8:
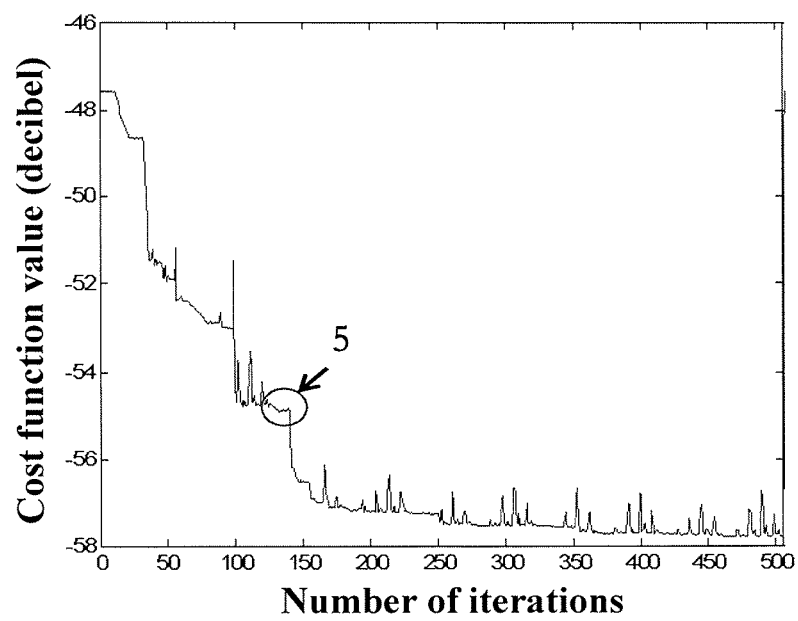
FIG. 8 illustrates a change in cost function value in the simulation according to the second embodiment of the present disclosure.

Simulation results for the second embodiment of the present disclosure will be given below with reference to FIG. 7 and FIG. 8. FIG. 7 and FIG. 8 illustrate changes in extremum probability Pe and in cost function value in a simulation according to the second embodiment of the present disclosure respectively.

In the simulation, the occurrence probability over a statistic period of time of the minimum of the output signal of the analog-digital converter 194 is taken as the distribution status, and the analog-digital converter 194 is a 1-bit analog-digital converter.

In FIG. 7, the abscissa represents the number of iterations performed for obtaining the converged cost function value, and the ordinate represents the value of the extremum probability Pe with the horizontal line 1 representing the target extremum probability Ptg=0.163 and the horizontal line 2 representing the threshold extremum probability Pth=0.02. In FIG. 8, the abscissa represents the number of iterations performed for obtaining the cost function value, and the ordinate represents the cost function value in decibel.

As illustrated in FIG. 7, firstly the variable gain g is adjusted at the point 3 so that the extremum probability Pe=Ptg. In the course of the subsequent iterations, Pe has an overall trend of declining despite some fluctuation, and in the meantime, the cost function value CF also declines gradually while fluctuating in FIG. 8.

When the extremum probability Pe drops to the threshold extremum probability Pth, the variable gain g is adjusted again at the point 4 so that the extremum probability Pe=Ptg. Also since the revised gain g_f is adjusted correspondingly, the cost function value is kept unchanged at the point 5 in FIG. 8 corresponding to the point 4 in FIG. 7. Thereafter the process is further iterated until the cost function value converges.

As can be apparent from FIG. 7, the variable gain g has been adjusted only a few times in the course of the iterations, thus improving the efficiency significantly over the existing automatic gain control method in which the variable gain g has to be adjusted all the time.

Furthermore, as can be apparent from FIG. 8, the cost function value has converged rapidly. The simulation result also demonstrated that convergence of the cost function value can be achieved rapidly in the variable gain control method according to the second embodiment of the present disclosure to thereby offer a possibility to better update adaptively the parameters.

The automatic gain control device and the automatic gain control method according to the second embodiment of the present disclosure have been described above with reference to FIG. 5 to FIG. 8.

In a power adjusting device, e.g., a power amplifying system, with an adaptive scalar pre-distorter, the automatic gain control device according to the second embodiment of the present disclosure can be on a feedback branch, for updating adaptively parameters of the adaptive scalar pre-distorter, of the power adjusting device, and the automatic gain control device takes a feedback signal as the input signal and outputs the cost function value, calculated from the analog-digital conversion result, for updating adaptively the parameters. The power adjusting device is an example of the power adjusting device according to the embodiment of the present disclosure.

In a radio transmitting system, the foregoing power adjusting device can be used to adjust in power a signal from an input source, and the adjusted signal can be transmitted. The radio transmitting system is an example of the radio transmitting system according to the embodiment of the present disclosure.

The automatic gain control device and the automatic gain control method according to the second embodiment of the present disclosure can be not only applicable to a feedback branch, of a power amplifier with an adaptive scalar pre-distorter, for updating adaptively parameters of the adaptive scalar pre-distorter, but also applicable to other system for which a similar feature is required, i.e., systems for which only a change in input signal is required without requiring a precision value of the input signal at each moment of time.

According to the second embodiment of the present disclosure, an analog-digital converter with a smaller dynamic range can be used to perform analog-digital conversion on the amplification result of the variable gain amplifier, that is, an analog-digital converter with a lower number of bits and even a 1-bit analog-digital converter can be used. Correspondingly an digital-analog converter with a smaller range can also be used. Thus the complexity in hardware of and thus the cost of the device can be lowered. Moreover the performance of the device can also be improved.

Furthermore, according to the second embodiment of the present disclosure, the variable gain of the variable gain amplifier may not necessarily be changed in real time any longer, thus improving the performance of the device. Moreover a cost of the device in operation can also be lowered.

According to the second embodiment of the present disclosure, the cost function can converge rapidly in the process of updating adaptively parameters to thereby offer a possibility to better update adaptively the parameters.

[6. Computer Example]

The respective constituent units, steps, etc., in the foregoing automatic gain control device and method according to the embodiments of the present disclosure can be configured in software, firmware, hardware or any combination thereof. In the case of being embodied in software or firmware, program constituting the software or firmware can be installed from a storage medium or a network to a machine with a dedicated hardware structure (e.g., a general-purpose computer 900 illustrated in FIG. 9) which can perform various functions of the foregoing constituent unit and sub-units when various pieces of programs are installed thereon.

Figure 9:
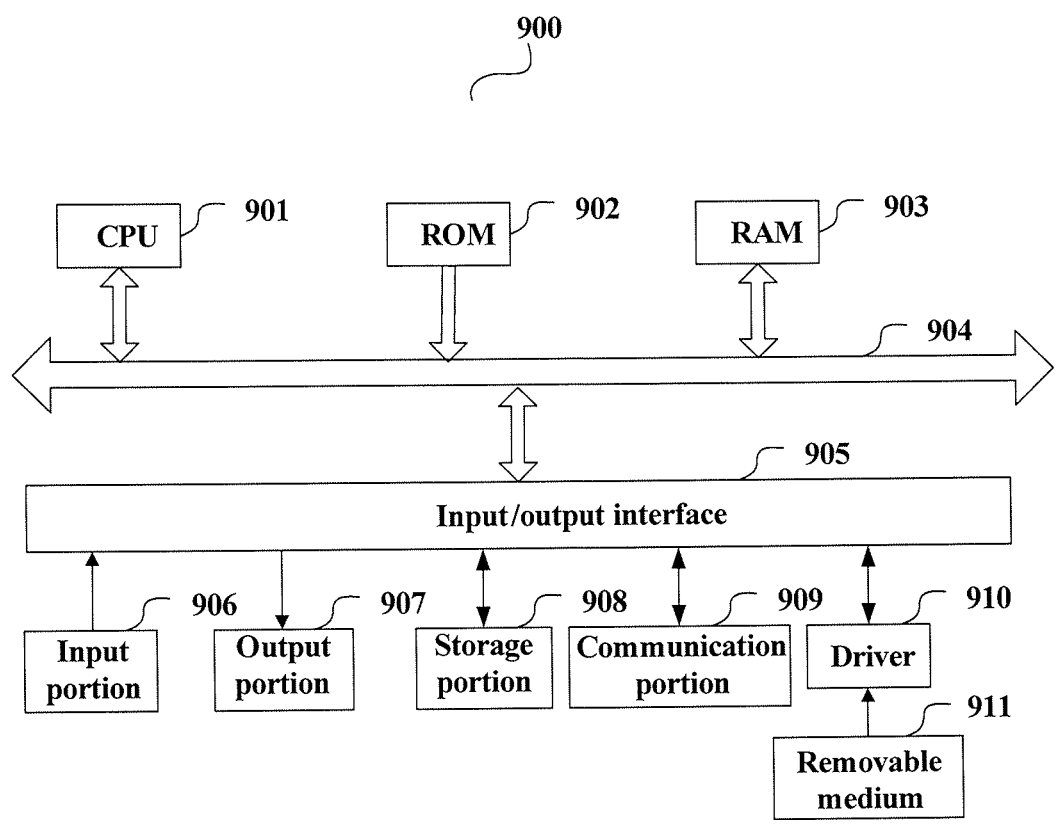
FIG. 9 illustrates a configuration of a computer system according to an embodiment of the present disclosure.

FIG. 9 illustrates a simplified structural diagram of a hardware configuration of a possible information processing equipment in which the automatic gain control device and method according to the embodiments of the present disclosure can be embodied.

In FIG. 9, a Central Processing Unit (CPU) 901 performs various processes according to program stored in a Read Only Memory (ROM) 902 or program loaded from a storage portion 908 into a Random Access Memory (RAM) 903 in which data required when the CPU 901 performs various processes, etc., is also stored as needed. The CPU 901, the ROM 902 and the RAM 903 are connected to each other via a bus 904 to which an input/output interface 905 is also connected.

The following components are also connected to the input/output interface 905: an input portion 906 (including a keyboard, a mouse, etc.); an output portion 907 (including a display, e.g., a Cathode Ray Tube (CRT), a Liquid Crystal Display (LCD), etc., a speaker, etc.); a storage portion 908 (including a hard disk, etc.); and a communication portion 909 (including a network interface card, e.g., a Local Area Network (LAN) card, a MODEM, etc). The communication portion 909 performs a communication process over a network, e.g., the Internet. A driver 910 can also be connected to the input/output interface 905 as required. A removable medium 911, e.g., a magnetic disk, an optical disk, an optic-magnetic disk, a semiconductor memory, etc., can be installed on the driver 910 as needed so that computer program fetched therefrom can be installed into the storage portion 908 as needed.

In the case that the foregoing series of processes are performed in software, program constituting the software can be installed from a network, e.g., the Internet, etc., or a storage medium, e.g., the removable medium 911, etc.

Those skilled in the art shall appreciate that such a storage medium will not be limited to the removable medium 911 illustrated in FIG. 9 in which the program is stored and which is distributed separately from the device to provide a user with the program. Examples of the removable medium 911 include a magnetic disk (including a Floppy Disk), an optical disk (including Compact Disk-Read Only memory (CD-ROM) and a Digital Versatile Disk (DVD)), an optic-magnetic disk (including a Mini Disk (MD) (a registered trademark)) and a semiconductor memory. Alternatively, the storage medium can be the ROM 902, a hard disk included in the storage portion 908, etc., in which the program is stored and which is distributed together with the device including the same to the user.

Furthermore the present disclosure further proposes a product program on which machine readable instruction codes are stored. The instruction codes upon being read and executed by a machine can perform the automatic gain control method according to the embodiment of the present disclosure. Correspondingly various storage mediums for bearing the program product, e.g., a magnetic disk, an optic disk, an optic-magnetic disk, a semiconductor memory, etc., are also be encompassed in the present disclosure.

In the foregoing description of the particular embodiments of the present disclosure, a feature(s) described and/or illustrated with respect to one implementation can be used identically or similarly in one or more other implementations in combination with or in place of a feature(s) in the other implementation(s).

Furthermore the method according to the respective embodiments of the present disclosure will not necessarily be performed in a temporal order described in the specification or illustrated in the drawings but can be performed in an alternative temporal order, concurrently or separately. Therefore the technical scope of the present disclosure will not be limited to the order in which the method is performed as described in the specification.

Furthermore, as can be apparent, the respective operating process of the method according to the present disclosure can also be performed in computer executable program stored in various machine readable storage mediums.

Furthermore, the object of the present disclosure can also be attained as follows: the storage mediums on which the foregoing executable program codes can be provided directly or indirectly to a system or a device, and a computer or a CPU in the system or the device can read and execute the program codes.

At this time an implementation of the present disclosure will not be limited to the program so long as the system or the device has the function of executing the program, and the program can also be in any form, e.g., object program, program executed by an interpreter, script program provided to an operating system, etc.

These machine readable storage mediums listed above include but will not be limited to various memories and storage units, semiconductor devices, magnetic disk units, e.g., optical, magnetic and optic-magnetic disks, other mediums suitable for storing information, etc.

Furthermore, the present disclosure can also be embodied by a client computer being connected to a corresponding website over the Internet and downloading and installing thereon the computer program codes according to the present disclosure and then executing the program.

Finally it shall be noted that such relationship terms in this context as the first and second, etc., are merely intended to distinguish one entity or operation from another entity or operation but not necessarily intended to require or suggest the presence of any such a real relationship or order between these entities or operations. Furthermore the terms "include", "comprise" and any variants thereof are intended to encompass nonexclusive inclusion, so that a process, a method, an article or a device including a series of elements includes both those elements and one or more other elements which are not listed explicitly or one or more elements inherent to the process, the method, the article or the device. Unless stated otherwise, an element being defined in the sentence "include/comprise a(n) . . . " will not exclude the presence of one or more additional identical element in the process, the method, the article or the device including the element.

In summary, the present disclosure provides the following solutions in the embodiments of the present disclosure.

Annex 1. An Automatic Gain Control, AGC, device, comprising:
mentment result;

an analog-digital converting unit, for performing analog-digital conversion on the adjustment result;

an analog-digital converting unit, for performing analog-digital conversion on the adjustment result to obtain an analog-digital conversion result; and a gain determining unit, for determining a distribution status over a predetermined period of time of a maximum or a minimum of the analog-digital conversion result, comparing the distribution status with a first distribution condition, and if the distribution status meets the first distribution condition, then keeping the variable gain corresponding to the distribution status unchanged, or if the distribution status does not meet the first distribution condition, then changing the variable gain corresponding to the distribution status and determining newly a distribution status until the newly determined distribution status meets a second distribution condition which is the same as or stricter than the first distribution condition.

Annex 2. The automatic gain control device according to annex 1, wherein:
the distribution status is an occurrence probability over the predetermined period of time of the minimum of the analog-digital conversion result, or an occurrence probability over the predetermined period of time of the maximum of the analog-digital conversion result.

Annex 3. The automatic gain control device according to annex 1 or 2, wherein:
the gain determining unit obtains the variable gain, which causes the distribution status to meet the second distribution condition, by a one-dimension searching algorithm.

Annex 4. The automatic gain control device according to any one of annexes 1 to 3, further including:
a cost function calculating unit, for calculating a cost function value according to the analog-digital conversion result.

Annex 5. The automatic gain control device according to annex 4, wherein:
the cost function value is in direct correlation with the square of the analog-digital conversion result.

Annex 6. The automatic gain control device according to annex 4 or 5, wherein:
the cost function calculating unit calculates the cost function value according to the analog-digital conversion result and a revised gain, and the gain determining unit determines a new revised gain each time the variable gain, which causes the distribution status to meet the second distribution condition, is obtained, in order to keep the cost function values, which are calculated before and after the variable gain is obtained, unchanged.

Annex 7. The automatic gain control device according to annex 6, wherein:
the gain determining unit stores the cost function value calculated before the variable gain, which causes the distribution status to meet the second distribution condition, is obtained, and determines the new revised gain according to the analog-digital conversion result obtained after the variable gain is obtained and to the stored cost function value.

Annex 8. The automatic gain control device according to annex 6 or 7, wherein:
the cost function calculating unit operates only during the time when the gain determining unit keeps the variable gain unchanged.

Annex 9. A power adjusting device with an adaptive scalar pre-distorter, wherein the AGC device according to any one of annexes 4-8 is on a feedback branch, for updating adaptively parameters of the adaptive scalar pre-distorter, of the power adjusting device, and the AGC device takes a feedback signal as the input signal and outputs the cost function value for updating adaptively the parameters.

Annex 10. A radio transmitting system, using the power adjusting device according to annex 9 to adjust in power a signal from an input source, and transmit the adjusted signal.

Annex 11. An Automatic Gain Control, AGC method, comprising:

adjusting an input signal by a variable gain and outputting an adjustment result;

performing analog-digital conversion on the adjustment result in order to obtain an analog-digital conversion result; and determining a distribution status over a predetermined period of time of a maximum or a minimum of the analog-digital conversion result, comparing the distribution status with a first distribution condition, and if such distribution status meets the first distribution condition, then keeping the variable gain corresponding to the distribution status unchanged, or if such distribution status does not meet the first distribution condition, then changing the variable gain corresponding to the distribution status and determining newly a new distribution status until the newly determined distribution status meets a second distribution condition which is the same as or stricter than the first distribution condition.

Annex 12. The AGC method according to annex 11, wherein the distribution status is an occurrence probability over the predetermined period of time of the maximum of the analog-digital conversion result, or an occurrence probability over the predetermined period of time of the minimum of the analog-digital conversion result.

Annex 13. The AGC method according to annex 11 or 12, wherein:

the variable gain, which causes the distribution status to meet the second distribution condition, is obtained by a one-dimension searching algorithm.

Annex 14. The AGC method according to any one of annexex 11 to 13, further including:

calculating a cost function value according to the analog-digital conversion result.

Annex 15. The AGC method according to annex 14, wherein:

the cost function value is in direct correlation with the square of the analog-digital conversion result.

Annex 16. The AGC method according to annex 14 or 15, wherein:

the cost function value is calculated according to the analog-digital conversion result and a revised gain, and a new revised gain is determined each time the variable gain, which causes the distribution status to meet the second distribution condition, is obtained, in order to keep the cost function values, which are calculated before and after the variable gain is obtained, unchanged.

Annex 17. The AGC method according to annex 16, wherein:

the cost function value, calculated before the variable gain which causes the distribution status to meet the second distribution condition is obtained, is stored, and the new revised gain is determined according to the analog-digital conversion result obtained after the variable gain is obtained and to the stored cost function value.

Annex 18. The automatic gain control method according to any one of annexes 14 to 17, wherein:

the cost function value is calculated only during the time when that the variable gain is kept unchanged.

Although the invention and the advantages thereof have been detailed, it shall be appreciated that various modifications, substitutions and variations can be made without departing from the spirit and scope of the invention as defined in the appended claims. Moreover, the scope of the invention will not be limited to the embodiments of the process, device, manufacture and structures of substance, means, methods and steps described in the specification. Those ordinarily skilled in the art can readily appreciate from the disclosure of the invention that process, device, manufacture and structures of substance, means, methods and steps known now or to be developed later, which perform substantially the same functions or achieve substantially the same results as the corresponding embodiments described here, can be utilized according to the invention. Therefore, the appended claims are intended to encompass in their scopes the process, device, manufacture and structures of substance, means, methods or steps.

Although the embodiments of invention have been detailed above with reference to the drawings, it shall be appreciated that the embodiments described above are merely intended to illustrate but not to limit the invention. Those skilled in the art can make various modifications and variations to the embodiments without departing from the spirit and scope of the invention. Accordingly the scope of the invention shall be defined only by the appended claims and their equivalents.

The invention claimed is:

1. An Automatic Gain Control, AGC, device, comprising:
a variable gain adjusting unit, for adjusting an input signal by a variable gain and outputting an adjustment result;
an analog-digital converting unit, for performing analog-digital conversion on the adjustment result to obtain an analog-digital conversion result; and
a gain determining unit, for determining a distribution status over a predetermined period of time of a maximum or a minimum of the analog-digital conversion result, comparing the distribution status with a first distribution condition, and if the distribution status meets the first distribution condition, then keeping the variable gain corresponding to the distribution status unchanged, or if the distribution status does not meet the first distribution condition, then changing the variable gain corresponding to the distribution status and determining newly a distribution status until the newly determined distribution status meets a second distribution condition which is the same as or stricter than the first distribution condition;
wherein the distribution status is an occurrence probability over the predetermined period of time of the minimum of the analog-digital conversion result, or an occurrence probability over the predetermined period of time of the maximum of the analog-digital conversion result.

2. The AGC device according to claim 1, wherein:
the gain determining unit obtains the variable gain, which causes the distribution status to meet the second distribution condition, by a one-dimension searching algorithm.

3. The AGC device according to claim 1, further comprising:
a cost function calculating unit, for calculating a cost function value according to the analog-digital conversion result.

4. The automatic gain control device according to claim 3, wherein:
the cost function value is in direct correlation with the square of the analog-digital conversion result.

5. The AGC device according to claim 3, wherein:
the cost function calculating unit calculates the cost function value according to the analog-digital conversion result and a revised gain, and the gain determining unit determines a new revised gain each time the variable gain, which causes the distribution status to meet the second distribution condition, is obtained, in order to keep the cost function values, which are calculated before and after the variable gain is obtained, unchanged.

6. The AGC device according to claim 5, wherein:
the gain determining unit stores the cost function value calculated before the variable gain, which causes the distribution status to meet the second distribution condition, is obtained, and determines the new revised gain according to the analog-digital conversion result obtained after the variable gain is obtained and to the stored cost function value.

7. The AGC device according to claim 5, wherein:
the cost function calculating unit operates only during the time when the gain determining unit keeps the variable gain unchanged.

8. A power adjusting device with an adaptive scalar pre-distorter, wherein the AGC device according to claim 3 is on a feedback branch, for updating adaptively parameters of the adaptive scalar pre-distorter, of the power adjusting device, and the AGC device takes a feedback signal as the input signal and outputs the cost function value for updating adaptively the parameters.

9. A radio transmitting system, using the power adjusting device according to claim 8 to adjust in power a signal from an input source, and transmit the adjusted signal.

10. An Automatic Gain Control, AGC method, comprising:
adjusting an input signal by a variable gain and outputting an adjustment result;
performing analog-digital conversion on the adjustment result in order to obtain an analog-digital conversion result; and
determining a distribution status over a predetermined period of time of a maximum or a minimum of the analog-digital conversion result, comparing the distribution status with a first distribution condition, and if such distribution status meets the first distribution condition, then keeping the variable gain corresponding to the distribution status unchanged, or if such distribution status does not meet the first distribution condition, then changing the variable gain corresponding to the distribution status and determining newly a distribution status until the newly determined distribution status meets a second distribution condition which is the same as or stricter than the first distribution condition;
wherein the distribution status is an occurrence probability over the predetermined period of time of the maximum of the analog-digital conversion result, or an occurrence probability over the predetermined period of time of the minimum of the analog-digital conversion result.

11. The AGC method according to claim 10, wherein:
the variable gain, which causes the distribution status to meet the second distribution condition, is obtained by a one-dimension searching algorithm.

12. The AGC method according to claim 10, further including:
calculating a cost function value according to the analog-digital conversion result.

13. The AGC method according to claim 12, wherein:
the cost function value is in direct correlation with the square of the analog-digital conversion result.

14. The AGC method according to claim 12, wherein:
the cost function value is calculated according to the analog-digital conversion result and a revised gain, and a new revised gain is determined each time the variable gain, which causes the distribution status to meet the second distribution condition, is obtained, in order to keep the cost function values, which are calculated before and after the variable gain is obtained, unchanged.

15. The AGC method according to claim 14, wherein:
the cost function value, calculated before the variable gain which causes the distribution status to meet the second distribution condition is obtained, is stored, and the new revised gain is determined according to the analog-digital conversion result obtained after the variable gain is obtained and to the stored cost function value.

16. The automatic gain control method according to claim 12, wherein:
the cost function value is calculated only during the time when that the variable gain is kept unchanged.

* * * * *